United States Patent [19]
Kogure et al.

[11] Patent Number: 6,015,008
[45] Date of Patent: Jan. 18, 2000

[54] HEAT RADIATING PLATE

[75] Inventors: Eiji Kogure; Tadashi Fukushima; Hiroaki Tsukahara; Toshihisa Imai; Takao Oshima, all of Hanazono-machi; Kunihiko Kaga, Tokyo, all of Japan

[73] Assignees: Mitsubishi Electric Home Appliance Co., Ltd., Saitama; Mitsubishi Denki Kabushiki Kaisha, Tokyo, both of Japan

[21] Appl. No.: 09/113,501

[22] Filed: Jul. 10, 1998

[30] Foreign Application Priority Data

Jul. 14, 1997 [JP] Japan ..................... 9-187997

[51] Int. Cl.[7] .................................... H05K 7/20
[52] U.S. Cl. .................. 165/185; 165/80.3; 165/121; 174/16.3; 257/722; 361/697; 361/704
[58] Field of Search .................. 165/80.3, 121, 165/122, 125, 126, 185, 146; 174/16.3; 257/722; 361/695, 697, 704

[56] References Cited

U.S. PATENT DOCUMENTS

| | | | |
|---|---|---|---|
| 3,163,207 | 12/1964 | Schultz | 165/185 X |
| 4,838,041 | 6/1989 | Bellows et al. | 165/80.2 X |
| 5,597,034 | 1/1997 | Barker, III et al. | 165/80.3 |
| 5,629,834 | 5/1997 | Kodama et al. | 361/695 |
| 5,661,638 | 8/1997 | Mira | 361/697 |

FOREIGN PATENT DOCUMENTS

| | | | |
|---|---|---|---|
| 2508727 | 9/1976 | Germany | 165/125 |
| 629148 | 4/1994 | Japan . | |
| 8195453 | 7/1996 | Japan . | |
| 8321571 | 12/1996 | Japan . | |

*Primary Examiner*—Leonard Leo

[57] ABSTRACT

Heat radiating fin plates in a curved shape are radially arranged on a heat radiating surface of a heat transfer plate, and a space is provided so as to be surrounded by inner edges of the heat radiating fin plates. The heat radiating fin plates have sidewalls formed with projections.

12 Claims, 6 Drawing Sheets

(a)   (b)

HEAT RADIATING PLATE

The present invention relates to a heat radiating plate which dissipates heat generated by a heat generating element such as a semiconductor device.

In FIG. 11 is shown a conventional heat radiating plate which has been disclosed in e.g. JP-U-629148. In FIG. 11, a view (a) is an a plan view of the conventional heat radiating plate, and a view (b) is a perspective view to explain cooling function under natural air-cooling. In these views, reference numeral 11 designates a heat transfer plate. The heat transfer plate 11 is prepared by cutting a rolled plate of high heat conductive aluminum alloy into a rectangular shape. The heat transfer plate is formed in a flat shape to have a slightly smaller contour than the top surface of a semiconductor device package to be coupled. Reference numeral 12 designates heat radiating fins. The heat radiating fins 12 are prepared by molding a material of aluminum alloy similar to the heat radiating plate 11 by extrusion so as to have a shaped section and cutting the molded material at a certain length. Each of the heat radiating fins is formed in such a curved shape so that it has a horizontal section formed so as to have a curvature which forms a part of a scroll directed from a peripheral portion to the center of the heat transfer plate 11 and it has a vertical section without a projection. The heat radiation fins are arranged in a radial pattern along respective scrolls directed to the center of the heat transfer plate 11 and are spaced with intervals therebetween without joining and contacting together at a central portion of the heat transfer plate. The heat radiating fins are bonded on the heat transfer plate 11 by a high heat conductive adhesive.

The function of the heat radiating plate will be explained. When the temperature of the heat radiating plate is raised by heat generated from the semiconductor device in the semiconductor device package, an ascending air current is formed on the heat radiating plate. As shown in FIG. 11(b), air current which is inspired from a peripheral direction by the formation of the ascending air current is spirally directed toward the central portion of the heat transfer plate through the gaps between the heat radiating fins 12 radially arranged along scrolls, and a whirlwind is generated at the central portion to accelerate and enhance the ascending air current at the central portion. In this manner, the heat in the heat radiating fins 12 is transferred to dissipate the heat generated from the semiconductor device.

Since the conventional heat radiating plate is constructed as stated earlier and works under natural air-cooling, the conventional heat radiating plate has created a problem in that increased dissipation of heat requires enlargement of the heat transfer plate or increased height of the heat radiating fins, preventing the entire heat radiating plate from being compact.

The arrangement of the heat radiating fins in the conventional heat radiating plate has a significant resistance to the air current between the heat radiating fins, creating a problem in that it is difficult to obtain good heat radiating efficiency.

It is an object of the present invention to solve these problems, and to provide a heat radiating plate which is small-sized and lightweight, and offers an high heat radiating effect.

According to a first aspect of the present invention, there is provided a heat radiating plate wherein a plurality of heat radiating fins are formed on a surface of a heat transfer plate, wherein the heat radiating fins are formed in a curved shape and are arranged in a radial pattern on the heat transfer plate, and wherein a space is provided on the surface of the heat transfer plate so as to be surrounded by inward edges of the heat radiating fins.

According to a second aspect of the present invention, the heat radiating fins have a sidewall formed with a plurality of projections in the first aspect.

According to a third aspect of the present invention, the projections on the sidewall of a heat radiating fin are staggered with respect to the projections on an opposed sidewall of an adjacent heat radiating fin in the second aspect.

According to a fourth aspect of the present invention, the projections have a height gradually increased from an inward portion toward an outward portion of the heat radiating fins in the second aspect.

According to a fifth aspect of the present invention, the projections are formed on inner and outer sidewalls of the heat radiating fins, and the projections on the inner sidewalls are higher than those on the outer sidewalls in the second aspect.

According to a sixth aspect of the present invention, the heat radiating fins are arranged on the heat transfer plate so that the heat radiating fins have the respective inward edges located on an imaginary circle on the heat transfer plate in the first aspect.

According to a seventh aspect of the present invention, the heat radiating fins are arranged on the heat transfer plate so that the heat radiating fins have respective outward edges located on an imaginary circle in the first aspect.

According to an eighth aspect of the present invention, the heat radiating fins are arranged on the heat transfer plate so that the heat radiating fins have the respective inward edges located on a first imaginary circle and respective outward edges located a second imaginary circle having a greater diameter than the first imaginary circle in the first aspect.

According to a ninth aspect of the present invention, the transfer plate is formed in a circular shape which is concentric with the imaginary circles of the inward and outward edges of the heat radiating fins in the eighth aspect.

According to a tenth aspect of the present invention, the heat radiating fins have a smaller thickness than the heat transfer plate in the first aspect.

In accordance with the first aspect, the resistance to the air current flowing between the heat radiating fins can be minimized to increase the current speed on the heat radiating fins. Supply of air from the space into gaps between the heat radiating fins and suction form the gaps between the heat radiating fins into the space can be effectively carried out to provide an increased heat radiating effect, making the heat radiating plate small and lightweight.

In accordance with the second aspect, a vortex can be generated on a downstream side of each of the projections to improve a heat transfer rate, providing a further increased heat radiating effect.

In accordance with the third aspect, the heat transfer rate of the entire heat radiating fins can be raised to improve the heat radiating effect.

In accordance with the fourth aspect, when air flows from the inward portion toward the outward portion, the heat transfer rate on the outward portion where the current speed is low can be raised to improve the heat radiating effect.

In accordance with the fifth aspect, the strong air which fits against on the inner sidewalls can be diffused toward the outer sidewalls to increase the heat radiating effect.

In accordance with the sixth aspect, the resistance to the air which enters between the heat radiating fins can be minimized, or a discharge of air can be equalized to improve the heat radiating effect.

In accordance with the seventh aspect, the discharge of air can be equalized or the resistance to the air which enters between the heat radiating fins can be minimized to improve the heat radiating effect.

In accordance with the eighth aspect, the heat radiating fins can be respective lengths equalized to avoid generation of a temperature difference, not only improving the heat radiating effect but also preventing noise from occurring.

In accordance with the ninth aspect, the heat transfer can be equalized not only to improve the heat radiating effect but also to make the heat radiating plate smaller.

In accordance with the tenth aspect, the heat radiating effect can be further improved.

EMBODIMENT 1

Figure 1:
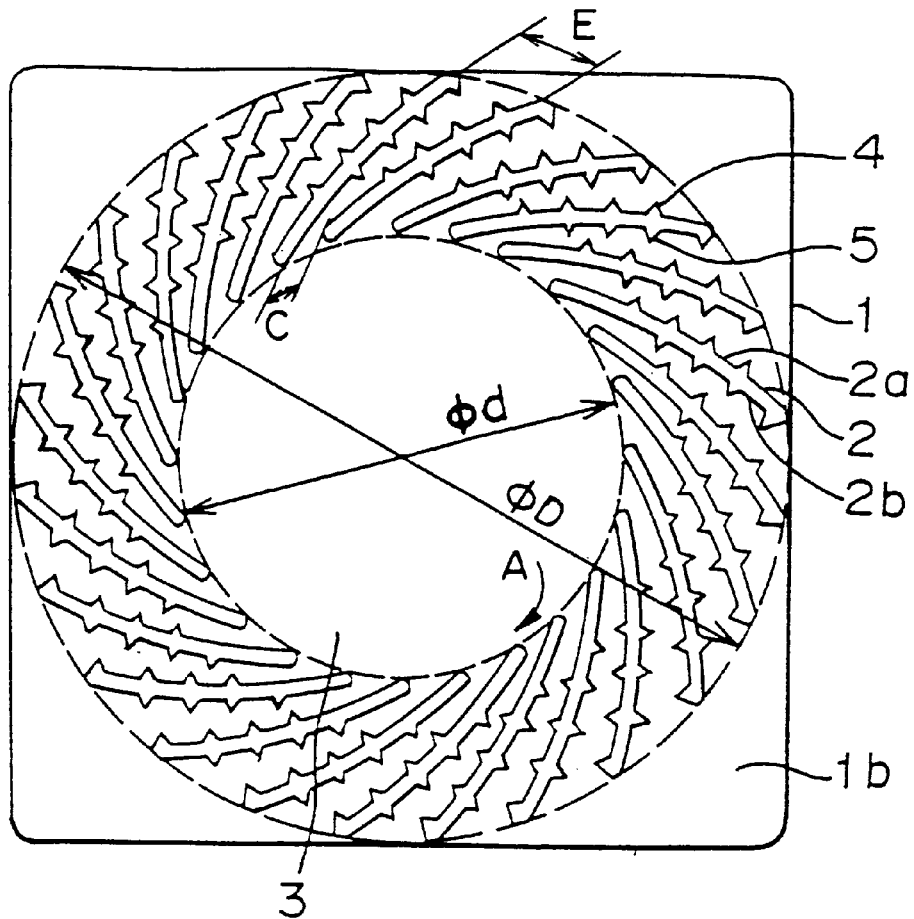
FIG. 1 is a plan view of the heat radiating plate according to a first embodiment of the present invention.
Figure 2:
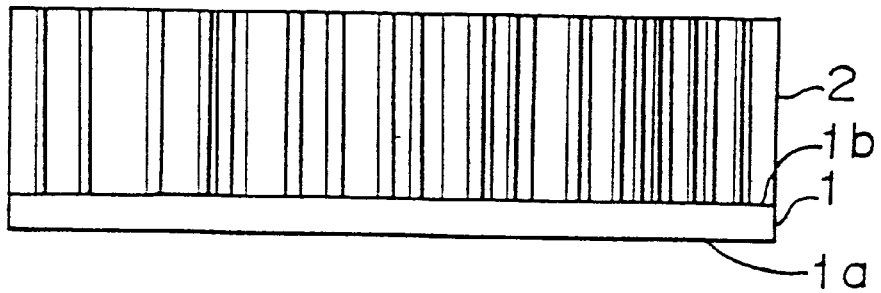
FIG. 2 is a side view of the heat radiating plate according to the first embodiment.

In FIG. 1 is shown a plan view of the heat radiating plate according to a first embodiment of the present invention. In FIG. 2 is shown a side view of the heat radiating plate. In these Figures, reference numeral 1 designates a heat transfer plate which is made of aluminum alloy and is formed in a substantially square shape. Reference numeral 1a designates a mounting surface of the heat transfer plate, to which a heat generating element such as a semiconductor device is fixed by a heat conductive adhesive. Reference numeral 1b designates a heat radiating surface which is opposite to the mounting surface 1a. Reference numeral 2 designates one of heat radiating fins which are made of an aluminum alloy plate like the heat transfer plate 1, which have a smaller thickness than the heat transfer plate 1, and which are arranged on the heat radiating surface 1b of the heat transfer plate 1 so as to extend perpendicularly thereto. Reference numeral 3 designates a space which is provided at a substantially central portion on the heat radiating surface 1b without provision of the heat radiating fins 2, and which works as an air inlet stated later on. Reference numeral 4 designates one of plural outer projections which project from an outer sidewall 2a of each of the heat radiating fins 2 in a curved shape and are formed in a substantially triangular shape in section. Reference numeral 5 designates one of plural inner projections which project from an inner sidewall 2b of each of the heat radiating fins 2 and are formed in a substantially triangular shape in section.

Figure 3:
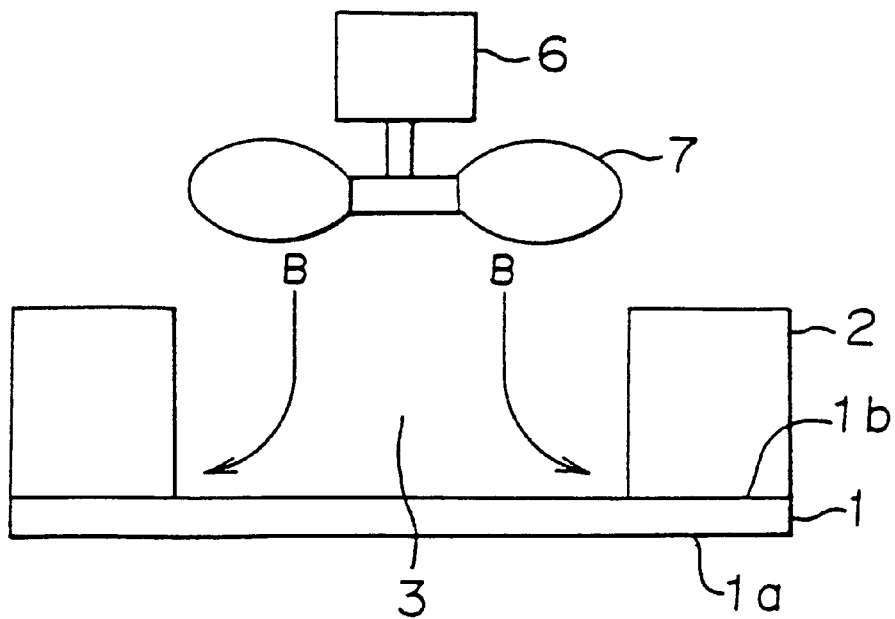
FIG. 3 is a schematic view showing a cooling function under forced air-cooling.

In FIG. 3 is shown a schematic view to explain a forced cooling function. Reference numeral 6 designates an electric motor, and reference numeral 7 designates a fan which is arranged to confront the air inlet 3 and which is driven by the electric motor 6 to supply cooling air in a direction B.

The heat radiating fins 2 are arranged on the heat radiating surface 1b of the heat transfer plate 1 so as to be radially directed from an inner portion toward an outer portion thereof at substantially equal intervals along the entire periphery thereof. Specifically, the heat radiating fins 2 are arranged in an annular shape so that respective inward edges of the heat radiating fins are located on an imaginary circle having a diameter d and so that respective outward edges of the heat radiating fins are located on another imaginary circle having a greater diameter D than the diameter d. The respective inward edges of the heat radiating fins 2 confront the air inlet 3. The gap between the inward edges of adjacent heat radiating fins 2 works as an inlet C for the cooling air supplied from the fan 7, and the gap between the outward edges of the adjacent heat radiating fins works as an outlet E for the cooling air. The outlet E is greater than the inlet C, and the divergent angle from the inlet C toward the outlet E is set at about 14 degree in the shown example to provide the air current with a diffusing effect.

Figure 4:
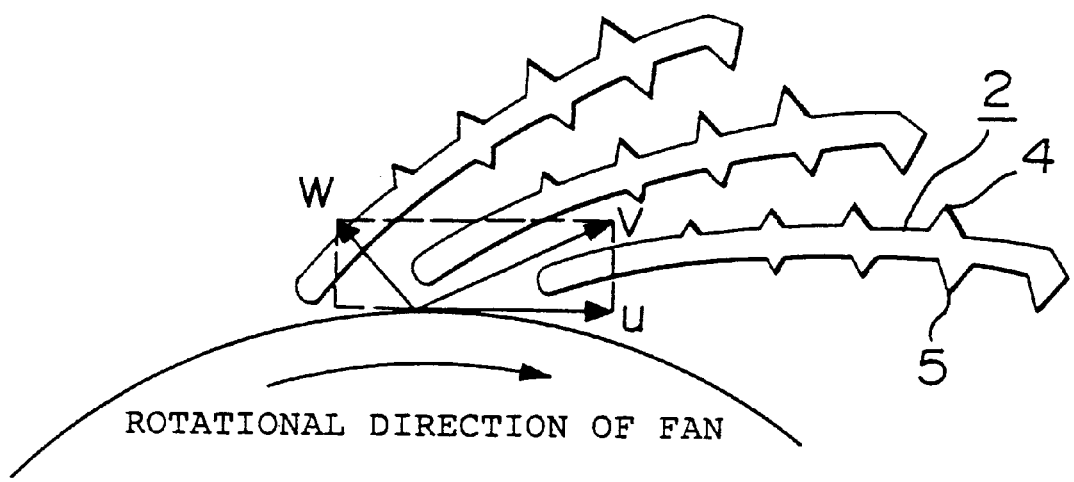
FIG. 4 is an enlarged view showing some of the heat radiating fins.

In order that the inlet C of adjacent heat radiating fins 2 is in alignment with the inflow angle of the cooling air, the heat radiating fins 2 are arranged on the heat radiating surface 1b of the heat transfer plate 1 at a certain angle with respect to the radial direction of the circle on which the respective inward edges of the heat radiating fins 2 are located. The heat radiating fins 2 are curved along the flow direction of the cooling air at a certain curvature. In other words, the heat radiating fins are arranged so that there is a relationship between a velocity vector at the outlet (outer diameter) of the fan 7 and the heat radiating fins 2 as shown in FIG. 4. In this Figure, reference U represents a peripheral velocity of the fan 7 (π×fan diameter×fan revolution), reference W represents a relative velocity of a discharge current with respect to the fan, and reference V represents an absolute velocity of the discharge current as viewed in terms of the rest frame, at which the discharge current enters the gap between the adjacent heat radiating fins 2 at the absolute velocity V. The angle of the inlet C between adjacent heat radiating fins 2 can be set to conform with the angle of the absolute velocity V (the discharge angle of the air A supplied by the fan 7) to minimize the flow resistance at the inlet of the heat radiating fins. The discharge current by the fan 7 flows out whirlwinding since it includes a velocity component in the peripheral direction. The respective curved heat radiating fins 2 are arranged in a scroll pattern to minimize the flow resistance in the passages defined by the heat radiating fins 2, providing smooth whirling currents.

As shown in FIG. 4, the outer projections 4 and the inner projections 5 are formed so that they have a height gradually increased from the side of each of the inlets C toward the side of each of the outlets E. The inner projections 5 are formed so that they are higher than the outer projection 4 in the corresponding orders with respect to the inlets. The outer projections 4 which project from the outer sidewall 2a of one of adjacent heat radiating fins 2 are staggered with respect to the inner projection 5 which project from the inner sidewall 2b of the other opposed heat radiating fin 2.

The heat radiating plate may be prepared by forming the heat transfer plate 1 and the heat radiating fins 2 in a one-piece construction, and the production of the heat radiating plate can be carried out by e.g. die-casting, liquid metal forging and forging. It is preferable that the aluminum alloy material has at least 90 wt % of aluminum included therein. The aluminum alloy material having such a content of aluminum has a high heat conductivity and provide a smooth flow of molten metal in shaping, making the shaping easy.

Now, the cooling function offered by the heat radiating plate according to this embodiment will be described referring to FIGS. 3–8. For example, a semiconductor device (not shown) is closely fixed to the mounting surface 1a of the heat transfer plate 1. When the semiconductor device is energized to generate heat, the heat is transferred to the heat radiating fins 2 through the heat transfer plate 1 to heat the heat radiating plate as a whole. Under such a circumstance, the fan 7 is driven by the electric motor 6 to supply cooling air to the heat radiating plate, cooling the heat radiating plate.

In general, the heat transfer rate of a heat radiating plate increases as the air current speed on the heat radiating fins of the heat radiating plate increases. From this standing point, the present invention provides the heat radiating fins 2 with a unique shape and arrangement in order to make the air current speed as fast as possible.

As shown by the arrows B in FIG. 3, the cooling air is supplied toward the air inlet 3, arrives at the heat radiating surface 1b, diffuses outwardly, enters the gaps between the heat radiating fins 2 through the inlets C, carries out heat exchange with the heat radiating fins 2, and is exhausted through the outlets E throughout the entire periphery of the heat radiating plate. Because the angle of the inlets C of the heat radiating fins 2 conforms to the discharge angle of the air supplied by the fan 7 as stated earlier, and because the air inlet 3 is formed in a circular shape, the resistance to the air is minimized when entering the inlets C. Since the heat radiating fins 2 are curved along the air flows, the passages defined by the heat radiating fins 2 have a small resistance to the flows to make the air current speed faster, obtaining a good heat radiating effect. Since the outer edges of the heat radiating fins 2 are located on the other circle, and since the heat radiating fins 2 have an equal length one another, discharge of the air is equalized to make heat resiasion equal. As a result, the respectively heat radiating fins 2 have no temperature difference one another, preventing noise from occurring.

Figure 5:
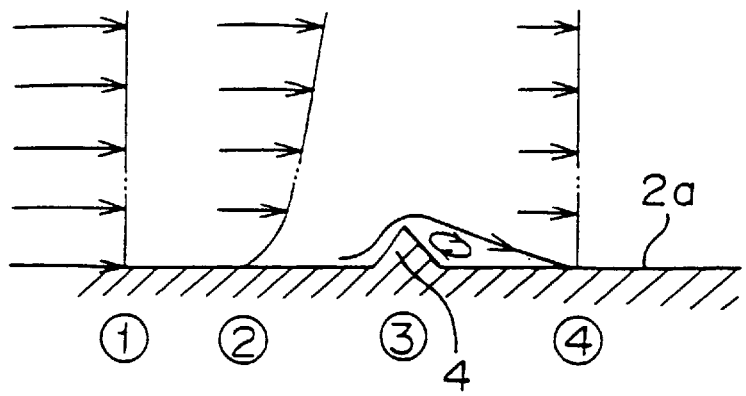
FIG. 5 is a schematic view showing air supply on a heat radiating fin.
Figure 6:
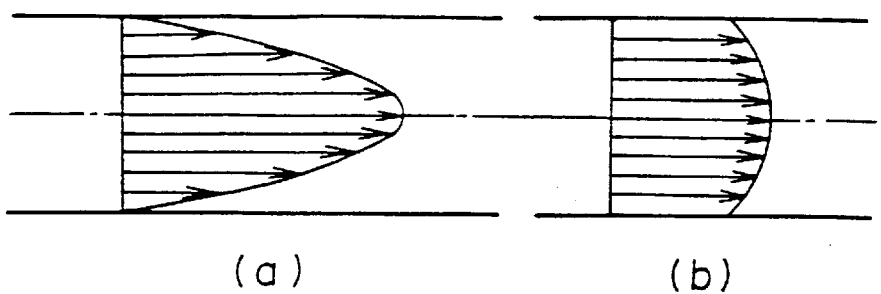
FIG. 6 is a schematic view showing fluid currents between parallel plates.

In FIG. 5 is shown a schematic view to explain how air flows along the outer sidewall 2a of a heat radiating fin 2. The air, which was a laminar flow at a point ①, has a portion thereof near to the outer sidewall 2a delayed by viscosity resistance of the outer sidewall 2a in comparison with a portion thereof away from the outer sidewall in terms of current speed (a point ②). The fluid flow between normal parallel plates will be explained, referring to FIG. 6. As shown in FIG. 6(a), the flow has such a parabola velocity distribution that it has portions thereof near to wall surfaces decelerated by the viscosity of the wall surfaces and a central portion thereof having the maximum velocity. When the current speed is fast, irregular mixing starts in the laminar flow to diffuse kinetic energy from the fast portion to the slow portions near to the sidewalls as so-called turbulence, making the velocity distribution uniform as shown in FIG. 6(b). In such a turbulent field, the current speed of the flow near to the sidewalls is fast, and the mixing function of air is hard to improve a heat transfer property. In the case of a heat radiating plate, the faster the air flows between the heat radiating fins 2, the faster portions of the air on the heat radiating fins 2 becomes to provide a good heat radiating effect. Although the radial arrangement of the curved heat radiating fins can provide some extent of current speed, this embodiment can provide a projection 4 at a point ③ to further improve the heat transfer property.

Figure 7:
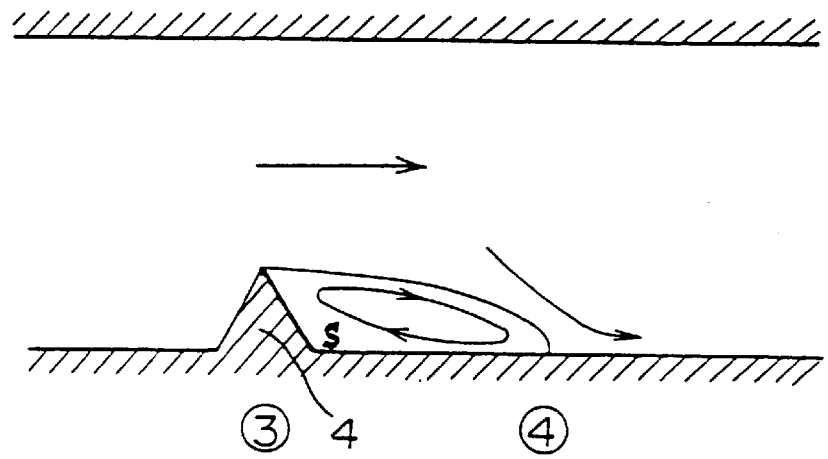
FIG. 7 is a schematic view showing currents downstream a projection.

In FIG. 7 is shown a schematic view of the air flow behind the projection 4 (a downstream side of the air flow). The air flow exfoliates at the point ③ because of the projection 4 and readheres at a point ④. A solid line connecting the points ③ and ④ represents the exfoliation boundary line of the air flow. Since strong turbulence (vortex) generated on the exfoliation boundary line comes near to the outer sidewall at a location near to the readhering point, the vortex causes strong velocity components to be produced in a direction perpendicular to the surface of the heat radiating fin 2 so that a perpendicular velocity component directed to the surface of the heat radiating fin 2 supplies the surface with cool air of a primary current away of the surface and the remaining perpendicular velocity component supplies the primary current with warm air on the surface. As a result, the heat transfer rate at the location near to the readhering point can be significantly improved.

In addition, in accordance with the first embodiment, the plural projections 4 on a sidewall of a heat radiating fin are staggered with respect to the plural projections 5 on an opposed sidewall of an adjacent heat radiating fin, further improving the heat transfer rate. Since an exfoliation area S surrounded by the exfoliation boundary line has a low heat transfer rate due to no contact with the primary current, and since the transfer rate at a location away from the readhering point toward the downstream side is low due to a decrease in the vortex, a small number of the projections are not enough to improve the entire heat transfer rate though a small number of the projections can locally improve the heat transfer rate. The staggered projections 4 and 5 can make each exfoliation region with a low heat transfer rate as narrow as possible, and repeats exfoliation and readhering to narrow portions with no vortex behind readhering points toward the downstream side.

Figure 8:
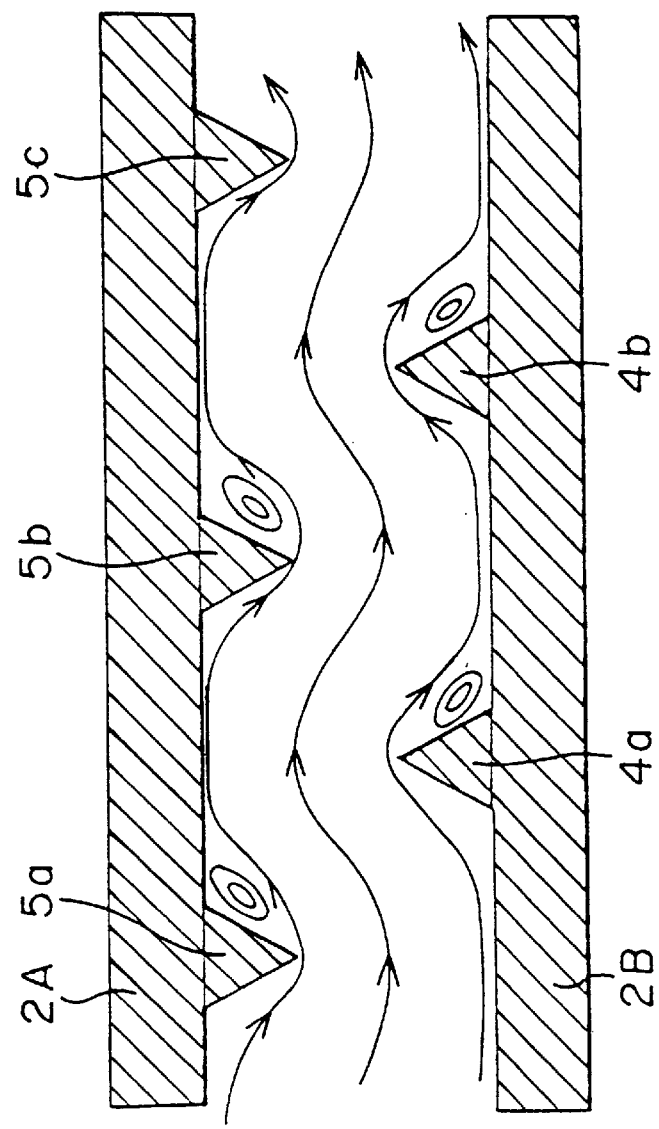
FIG. 8 is a schematic view showing air currents between heat radiating fins.

In FIG. 8 schematically shown how air flows between opposed heat radiating fins 2. In this Figure, the upper heat radiating fin is indicated by the reference numeral 2A, and the lower heat radiating fin is indicated by reference numeral 2B. Reference numerals 5a, 5b and 5c designate inner projection which are formed on the inner sidewall 2b of the heat radiating fin 2A. Reference numerals 4a and 4b designate outer projections which are formed on the outer sidewall 2a of the heat radiating fin 2B. The inner projections 5a, 5b, 5c are arranged so as to stagger with respect to the outer projections 4a, 4b.

The air currents which have entered from the left side in FIG. 8 are deviated toward the lower heat radiating fin 2B by the first inner projection on the heat radiating fin 2A. The air currents which have been deviated downward are deviated upward by the first outer projection 4a on the heat radiating fin 2B. As a result, the air currents which have exfoliated at the first inner projection 5a readhere to the heat radiating fin 2A rapidly. Such a phenomenon is repeated by the projections 5a, 5b and 5c on the downstream side. The staggering arrangement of the projections on the opposed sidewall of the adjacent heat radiating fins 2 allows the distance from exfoliation to the readhering point of the air currents to be shortened. The successive arrangement of the projections can provide the readhering points at a plural locations to remarkably improve the heat transfer rate.

The pitch between adjacent projections on a single sidewall is required to have such requirements that the air currents can readhere at a location at least between the adjacent projections. The requirements are determined by the shape of the projections, the height of the projections, current speed, the distance between the adjacent heat radiating fins, the curvature of the heat radiating fins and so on.

As the air which has entered between the opposed heat radiating fins 2 moves toward the outer peripheral direction, the surface viscosity of the heat radiating fins 2 causes the current speed to decrease, lowering heat recovery. However, the provision of the outer and inner projections 4 and 5 can increase the heat transfer rate since the outer projections 4 and the inner projections 5 have a height thereof gradually increased toward the outer side of the heat radiating plate.

Although the air which is passing between the opposed heat radiating fins 2 includes a strong portion on the side of the inner sidewall 2b of the upper heat radiating fin 2 and a weak portion on the side of the outer sidewall 2a of the lower heat radiating fin, the inner projections 5 are formed so as to be higher than the outer projections 4 in corresponding orders from the air inlet. As a result, the strong portion of the air which hits against the inner sidewall 2b is diffused toward the outer sidewall 2a, improving the heat radiating effect.

Since the heat radiating fins 2 are thinner than the heat radiating plate 1, the heat which has been absorbed from the heat generating element by the heat radiating plate 1 can be easily diffused through the heat radiating fins 2, providing good heat radiating efficiency. The reduced thickness of the heat radiating fins 2 can increase the number of the heat radiating fins 2 keeping a required opening ratio for the inlets C of the cooling air. As a result, the heat radiating effect can be improved.

The cross-sectional area of each of the heat radiating fins 2 which is obtained by being cutting at a plane parallel with the heat transfer rate 1 is greater than the cross-sectional area of heat radiating pins which are arranged at plural positions on a portion where each of the heat radiating fins occupies. The provision of the heat radiating fins can provide good heat conduction and a good heat radiating effect.

Although explanation has been made with respect to a case wherein the air inlet is formed in a circular shape, any shape of space which allows the cooling air supplied by the fan 7 to enter the inlets C of the heat radiating fins 2 provides similar effects.

Although explanation has been made with respect to a case wherein the air is supplied from the inward side to the outward side of the heat radiating plate, a similar heat radiating effect can be obtained by inspiring the air with the fan to produce air flows directed from the outward side to the inward side of the heat radiating plate. If a cover is provided to close an opening portion of the heat radiating fins 2 confronting the fan 7, the air which has been taken in between the outward edges of the heat radiating fins is ensured to pass the passages between the heat radiating fins 2 and to be inspired into the fan 7 through the space 3, providing a superior heat radiating effect.

EMBODIMENT 2

Figure 9:
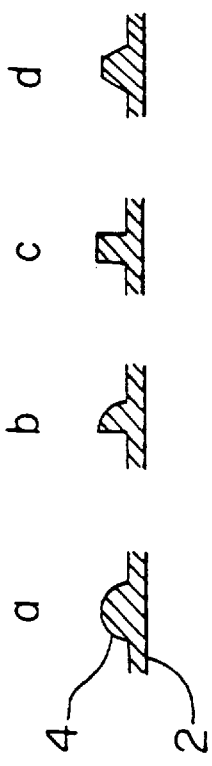
FIG. 9 is sectional views showing different projections according to a second embodiment of the present invention.

Although the cross-sectional shape of the projections is triangular in the first embodiment, the cross-sectional shape may be semicircular as shown in FIG. 9a, quarter circular as shown in FIG. 9b, rectangular as shown in FIG. 9c and trapezoidal as shown in FIG. 9d. Whatever shape the projections have, a similar effect can be obtained as long as the projections project from the heat radiating fins 2.

EMBODIMENT 3

Figure 10:
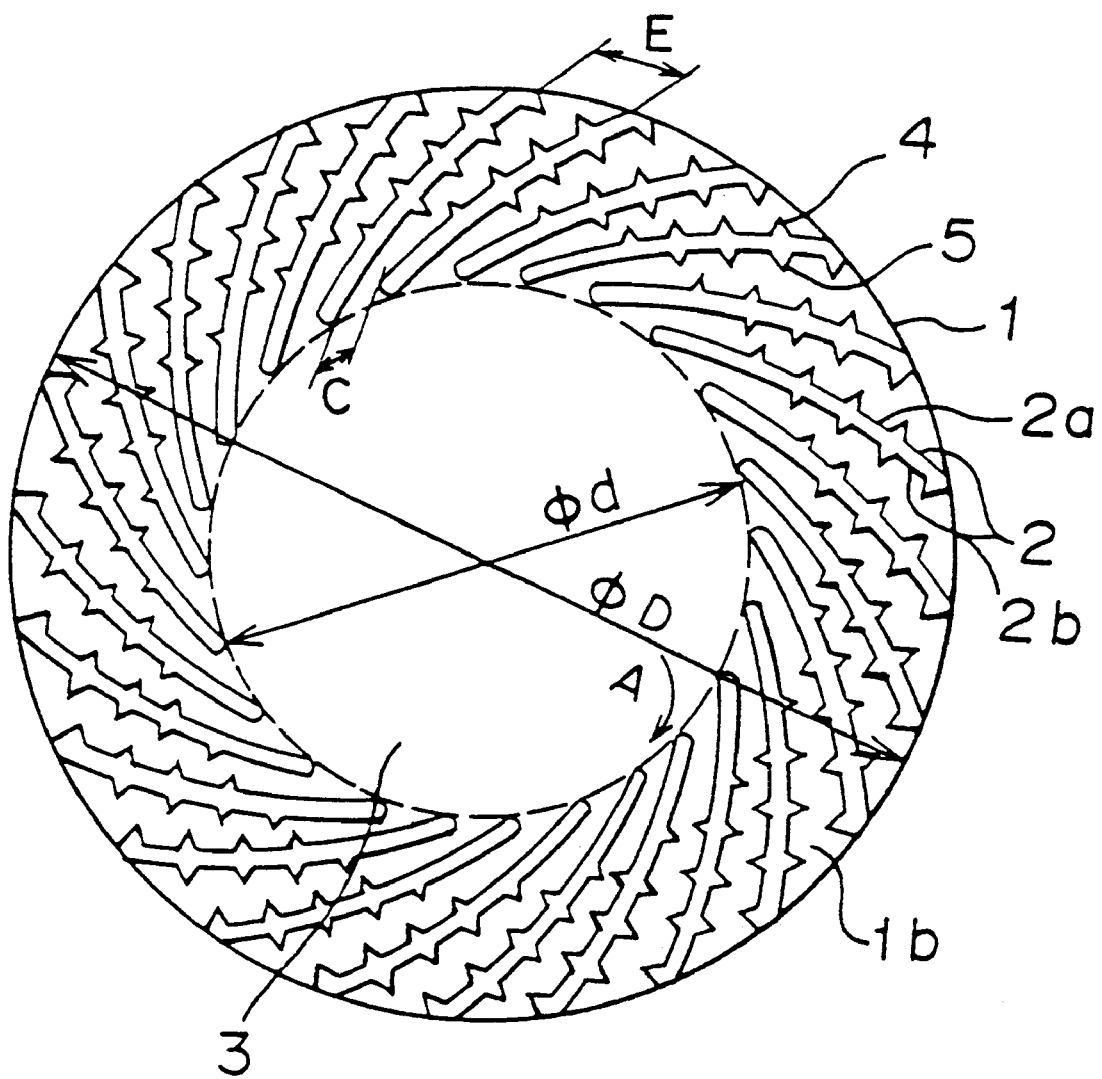
FIG. 10 is a plan view of the heat radiating plate according to a third embodiment of the present invention.
Figure 11A:
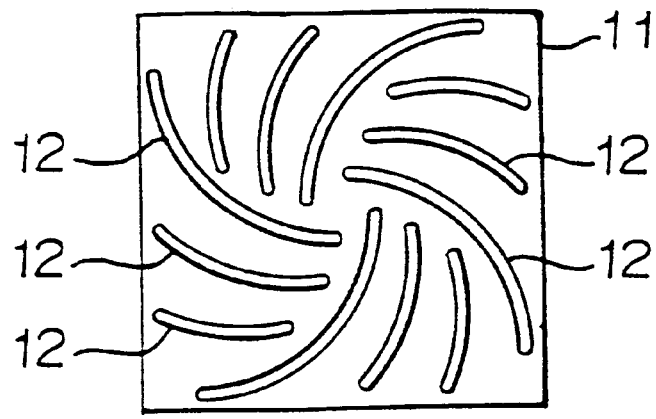
FIG. 11 is a plan view (a) and a perspective view (b) showing a conventional heat radiating plate.
Figure 11B:
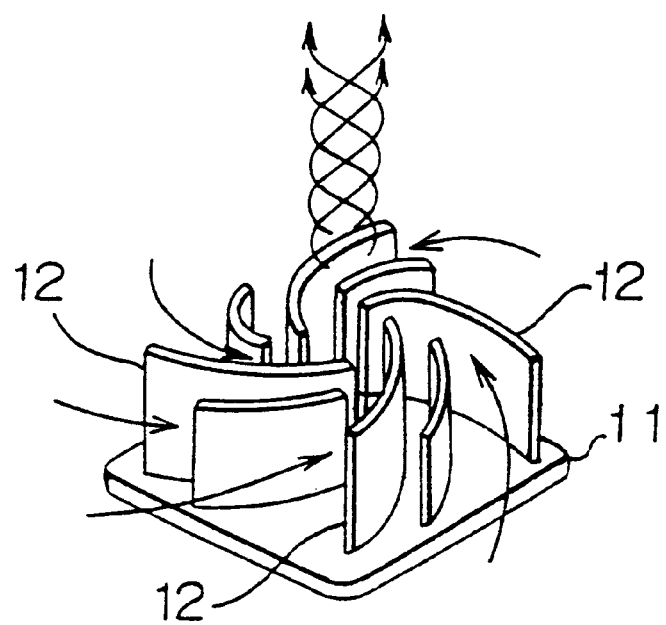

In FIG. 10 is shown a plan view of the heat radiating plate in accordance with a third embodiment. In this embodiment, the plane shape of the heat transfer plate 1 is circular like the outer periphery of the heat radiating fins 2. Such a shape can equalize the heat transfer from the heat transfer plate 1 to the heat radiating fins 2, further improving the heat radiating effect. If the heat transfer plate 1 has the same diameter of the outer periphery of the heat radiating fins 2 as shown in FIG. 10, the heat radiating plate can be made smaller.

The shape of the heat transfer plate 1 is not limited to the example stated earlier. The shape of the heat transfer plate may be rectangular. The heat radiating fins 2 may be arranged so as to occupy a location shifted from the central portion of the heat transfer plate 1.

What is claimed is:

1. A heat radiating plate comprising:

a heat transfer plate; and a plurality of heat radiating fins formed on a surface of the heat transfer plate, wherein the heat radiating fins are formed in a curved shape and are arranged in a radial pattern on the heat transfer plate, a space is provided on the surface on the heat transfer plate so as to be surrounded by inward edges of the heat radiating fins, the heat radiating fins have at least one side wall formed with a plurality of projections, the projections are formed on inner and outer side walls of the heat radiating fins, and the projections on the inner side walls are higher than those on the outer side walls in corresponding order.

2. The heat radiating plate according to claim 1, wherein projections on opposed side walls of adjacent heat radiating fins which define the coolant passage are staggered with respect to each other.

3. The heat radiating plate according to claim 1, wherein the heat radiating fins are arranged on the heat transfer plate so that the heat radiating fins have respective inward edges located on a first imaginary circle on the heat transfer plate.

4. The heat radiating plate according to claim 1, wherein the heat radiating fins are arranged on the heat transfer plate so that the heat radiating fins have respective outward edges located on the second imaginary circle on the heat transfer plate.

5. The heat radiating plate according to claim 1, wherein the heat radiating fins are arranged on the heat transfer plate so that the heat radiating fins have respective inward edges located on the first imaginary circle on the heat transfer plate, and so that the heat radiating fins have respective outward edges located on a second imaginary circle on the heat transfer plate, the second imaginary circle having a greater diameter than that the first imaginary circle.

6. The heat radiating plate according to claim 5, wherein the heat transfer plate is formed in a circular shape which is concentric with the first and second imaginary circles.

7. The heat radiating plate according to claim 1, wherein the heat radiating fins have a small thickness than the heat transfer plate.

8. A heat radiating plate comprising:

a heat transfer plate; and a plurality of heat radiating fins formed on a surface of the heat transfer plate, wherein the heat radiating fins are formed in a curved shape and are arranged in a radial pattern on the heat transfer plate, a space is provided on the surface of the heat transfer plate so as to be surrounded by inward edges of the heat radiating fins, the heat radiating fins have a side wall formed with a plurality of projections, and the projections have a height gradually increased from an inward portion toward an outward portion of the heat radiating fins.

9. A heat radiating plate comprising:

a heat transfer plate; and a plurality of heat radiating fins arranged in a radial pattern on a surface of said heat transfer plate such that adjacent heat radiating fins define a coolant passage extending between a coolant inlet and coolant outlet, each heat radiating fin having a curved shape and including a plurality of projections extending from at least one side wall surface thereof in a direction transverse to said coolant passage, wherein each projection generates a vortex on a downstream side of the projection as coolant flows through the coolant passage in a direction from the coolant inlet to the coolant outlet, the vortex causing an increase in heat transfer rate between adjacent projections, and the projections have a height gradually increasing from an inward portion toward an outward portion of the heat radiating fins.

10. A heat radiating plate comprising:

a heat transfer plate; and a plurality of heat radiating fins arranged in a radial pattern on a surface of said heat transfer plate such that adjacent heat radiating fins define a coolant passage extending between a coolant inlet and coolant outlet, each heat radiating fin having a curved shape and including a plurality of projections extending from at least one side wall surface thereof in a direction transverse to said coolant passage, wherein each projection generates a vortex on a downstream side of the projection as coolant flows through the coolant passage in a direction from the coolant inlet to the coolant outlet, the vortex causing an increase in heat transfer rate between adjacent projections, projections are formed on inner and outer side wall surfaces of the heat radiating fins, and the projections on the inner side wall surface are higher than the projections on the outer side wall surface in corresponding order.

11. A heat radiating plate comprising:

a heat transfer plate; and a plurality of heat radiating fins arranged in a radial pattern on a surface of said heat transfer plate so that adjacent heat radiating fins define a coolant passage extending between a coolant inlet and coolant outlet, each heat radiating fin including a plurality of projections extending perpendicularly from at least one side wall surface thereof, wherein said plurality of projections are spaced apart from each other along said side wall surface so that coolant flowing through said coolant passage in a direction from said coolant inlet to said coolant outlet exfoliates from said side wall surface and readheres to said side wall surface between adjacent projections, and the projections have a height gradually increasing from an inward portion toward an outward portion of the heat radiating fins.

12. A heat radiating plate comprising:

a heat transfer plate; and a plurality of heat radiating fins arranged in a radial pattern on a surface of said heat transfer plate so that adjacent heat radiating fins define a coolant passage extending between a coolant inlet and coolant outlet, each heat radiating fin including a plurality of projections extending perpendicularly from at least one side wall surface thereof, wherein said plurality of projections are spaced apart from each other along said side wall surface so that coolant flowing through said coolant passage in a direction from said coolant inlet to said coolant outlet exfoliates from said side wall surface and readheres to said side wall surface between adjacent projections, projections are formed on inner and outer side wall surfaces of the heat radiating fins, and the projections on the inner side wall surface are higher than the projections on the outer side wall surface in corresponding order.

* * * * *